(12) United States Patent
Nagy et al.

(10) Patent No.: US 11,309,198 B2
(45) Date of Patent: Apr. 19, 2022

(54) WAFER PROCESSING SYSTEM

(71) Applicant: SPTS Technologies Limited, Newport (GB)

(72) Inventors: Attila Nagy, Newport (GB); Kris Martin, Newport (GB)

(73) Assignee: SPTS Technologies Limited, Newport (GB)

( * ) Notice: Subject to any disclaimer, the term of this patent is extended or adjusted under 35 U.S.C. 154(b) by 103 days.

(21) Appl. No.: 16/919,180

(22) Filed: Jul. 2, 2020

(65) Prior Publication Data

US 2021/0082722 A1 Mar. 18, 2021

(30) Foreign Application Priority Data

Sep. 16, 2019 (GB) ..................................... 1913356

(51) Int. Cl.
*H01L 21/67* (2006.01)
*H01L 21/677* (2006.01)
*H01L 21/68* (2006.01)

(52) U.S. Cl.
CPC .. *H01L 21/67201* (2013.01); *H01L 21/67207* (2013.01); *H01L 21/67742* (2013.01); *H01L 21/67778* (2013.01); *H01L 21/68* (2013.01)

(58) Field of Classification Search
CPC ......... H01L 21/67742; H01L 21/67207; H01L 21/67201; H01L 21/68
See application file for complete search history.

(56) References Cited

U.S. PATENT DOCUMENTS

| 5,509,771 A | 4/1996 | Hiroki |
| 2003/0161706 A1 | 8/2003 | Kurita et al. |
| 2008/0187413 A1 | 8/2008 | Kondoh |

FOREIGN PATENT DOCUMENTS

| EP | 2282331 A2 | 2/2011 |
| JP | 2001035904 A | 2/2001 |
| JP | 2012059758 A | 3/2012 |
| KR | 20060121542 A | 11/2006 |
| KR | 20070000145 A | 1/2007 |

OTHER PUBLICATIONS

IPO, Search Report for GB Application No. 1913356.0, dated Jan. 29, 2020.

*Primary Examiner* — Saul Rodriguez
*Assistant Examiner* — Willie Berry, Jr.
(74) *Attorney, Agent, or Firm* — Hodgson Russ LLP

(57) ABSTRACT

A wafer processing system has a transport vacuum chamber for handling a frame assembly under vacuum conditions, at least one vacuum cassette elevator load lock for housing a cassette and adjusting a vertical position of the cassette under vacuum conditions, and at least one wafer processing module in vacuum communication with the transport vacuum chamber. An actuating assembly changes guide members from an expanded configuration to a contracted configuration to reduce a first cross-sectional dimension of a frame assembly receiving area and to reduce a second cross-sectional dimension of the frame assembly receiving area that is perpendicular to the first cross-sectional dimension.

25 Claims, 6 Drawing Sheets

WAFER PROCESSING SYSTEM

CROSS-REFERENCE TO RELATED APPLICATIONS

This application claims priority to the provisional patent application filed Sep. 16, 2019 and assigned UK Patent Application No. 1913356.0, the disclosure of which is hereby incorporated by reference.

FIELD OF THE DISCLOSURE

This invention relates to a wafer processing system. This invention relates also to a vacuum chamber (henceforth, the 'transport vacuum chamber') for handling a frame assembly. This invention also relates to associated methods of handling a frame assembly. This invention also relates to an alignment device for adjusting a translational and rotational position of a frame assembly into alignment with a target position; and to methods of adjusting the translational and rotational position of a frame assembly.

BACKGROUND OF THE DISCLOSURE

In semiconductor processing systems, the workpiece to be processed can be transferred by a robot between a loading port, such as a front opening unified port (FOUP), with a load lock or a VCE (vacuum cassette elevator) load lock to a transport vacuum chamber, and one or more processing modules. The load lock is used to depressurise and if required de-gas the workpiece when it is transferred from the loading port (at atmospheric pressure) to the transport vacuum chamber, whilst maintaining a high vacuum in the transport vacuum chamber. Similarly, the load lock is used to depressurise the workpiece before transferring it back to the loading port.

A typical workpiece is a frame assembly comprising a wafer, as shown in FIG. 1. A frame assembly 100 typically comprises a substantially annular frame 102 covered with an adhesive tape 106. The outer perimeter of the annular frame 102 has four straight edges 104, which are arranged so that adjacent straight edges 104 are perpendicular. The diameter of the frame assembly 100 therefore varies depending on the angle of measurement, with the shortest diameter being between opposite straight edges 104. The adhesive tape 106 is typically tolerant to the plasma processing conditions used during the plasma dicing process. The wafer to be processed 108 is typically positioned centrally on the adhesive tape 106.

Due to the varying diameter of the frame 102, the frame assembly 100 must have the correct translational and rotational orientation and alignment to be successfully inserted into the loading port (e.g. cassette) after processing. However, the transfer robot typically has no way to control the relative position of the frame assembly on the end effector of the robot. As the frame assembly is collected, placed and transferred within the processing system by the robot, the frame assembly may become translationally or rotationally offset on the end effector of the robot arm. Consequently, when the robot tries to return the frame assembly to the loading port, the frame assembly might be misaligned with the opening in loading port, and the frame assembly might not be able to be successfully inserted into the loading port (e.g. cassette). In such cases, a mishandling event will occur.

Some load locks comprise alignment devices that use a slow spinning table and optics to determine the position of the frame assembly. A computer then calculates the position of the frame assembly and adjusts the position of the robot accordingly to collect the frame assembly with the correct alignment prior to returning the frame assembly into the loading port. However, these known methods are challenging to implement under vacuum conditions while minimising tool footprint. It is desirable to develop an apparatus for more efficiently aligning frame assemblies under vacuum conditions, which minimises tool footprint and cost.

BRIEF SUMMARY OF THE DISCLOSURE

The present invention, in at least some of its embodiments, seeks to address some of the above described problems, desires and needs. In particular, embodiments of the invention seek to improve the translational and rotational alignment of a frame assembly so as to reduce the frequency of mishandling events. Additionally, the present invention seeks to develop an apparatus that is better suited to align a frame assembly under vacuum conditions, and that can lead to a processing system having a smaller tool footprint.

According to a first aspect of the invention there is provided a wafer processing system comprising:

- a transport vacuum chamber for handling a frame assembly under vacuum conditions;
- at least one vacuum cassette elevator load lock for housing a cassette and adjusting the vertical position of the cassette under vacuum conditions, wherein the at least one cassette vacuum chamber is in vacuum communication with the transport vacuum chamber; and
- at least one wafer processing module in vacuum communication with the transport vacuum chamber;

wherein the transport vacuum chamber comprises:

- an alignment device for adjusting a translational and rotational position of the frame assembly into alignment with a target position within the transport vacuum chamber; and
- a transfer robot disposed within the transport vacuum chamber for transferring the frame assembly between the at least one cassette vacuum chamber, the at least one alignment device, and the at least one wafer processing module under vacuum conditions;

in which the alignment device comprises:

- a positioning assembly disposed within the transport vacuum chamber comprising a plurality of guide members that are arranged to define a frame assembly receiving area within the transport vacuum chamber;
- at least one support for supporting the frame assembly in the frame assembly receiving area; and
- an actuating assembly operable to change the plurality of guide members from an expanded configuration to a contracted configuration so as to reduce a first cross-sectional dimension of the frame assembly receiving area and to reduce a second cross-sectional dimension of the frame assembly receiving area that is perpendicular to the first cross-sectional dimension;

wherein when plurality of guide members change from the expanded configuration to the contracted configuration while the frame assembly is supported on the at least one support, the plurality of guide members engage with the frame assembly so as to adjust the translational and/or rotational position of the frame assembly into alignment with the target position. In use, the transport vacuum chamber can be evacuated so as to form a vacuum within the transport vacuum chamber. The transport vacuum chamber is suitable for operating under vacuum conditions, for example, at pressures of less than about 100 Torr. The translational position is typically the translational position in a plane of the frame assembly receiving area. The rotational position is typically the rotational position about an axis perpendicular to the plane of the frame assembly receiving area. As the plurality of guide members are changed from the expanded configuration to the contracted configuration, the guide members push the frame assembly that is being supported on the support towards the target position. The target position is the desired translational and rotational position of the frame assembly on the alignment device. The alignment device can be used to adjust the translational position of the frame assembly into alignment with the target position within a tolerance of ±1 mm. The device of the first aspect can be used to adjust the rotational position of the frame assembly into alignment with the target position to within a tolerance of ±1°. When a frame assembly has been translationally and rotationally aligned with the desired target position, the frame assembly can be positioned on a transfer robot with better accuracy and precision. Consequently, the frequency of mishandling events can be significantly reduced. Additionally, the transfer robot can place the frame assembly, for example into a wafer processing module, with high accuracy and precision. When the support is supporting a frame assembly, the plurality of guide members can be arranged to confine the position of the frame assembly to within the frame assembly receiving area. In use, each of the plurality of guide members can contact the frame assembly when in the contracted configuration. In use, each of the plurality of guide members can be disengaged with the frame assembly when in the expanded configuration. The frame assembly receiving area defined by the plurality of guide members when in the expanded configuration is larger than the area defined by the plurality of guide members when in the contracted configuration. The frame assembly receiving area defined by the plurality of guide members in the contracted configuration can substantially correspond to shape of the target position. The contracted configuration can comprise the plurality of guide members being arranged to substantially correspond to at least a part of a perimeter of the target position. The plurality of guide members can be evenly or unevenly distributed around the periphery of the frame assembly receiving area.

The plurality of guide members can comprise a first guide member movable from the expanded configuration to the contracted configuration so as to reduce the first cross-sectional dimension of the frame assembly receiving area.

The first guide member can be movable (e.g. slidable) along the first cross-sectional dimension (or first axis) from a radially outward position to a radially inward position. When the first guide member moves from the expanded configuration to the contracted configuration while the at least one support is supporting the frame assembly, the first guide member can engage with the frame assembly thereby adjusting the translational and optionally the rotational position of the frame assembly into alignment with the target position. For example, the first guide member can adjust the translational position of the frame assembly in a direction along the first cross-sectional dimension.

The plurality of guide members can comprise a second guide member, wherein the first and second guide members are disposed on substantially opposite sides of the frame assembly receiving area. The first and second guide members can be disposed more than 90° to each other around the frame assembly receiving area.

The second guide member can be a stop member, which can prevent further adjustment of the frame assembly in the direction of movement of the first guide member (e.g. along the first dimension).

The second guide member can be movable from the expanded configuration to the contracted configuration to reduce the first cross-sectional dimension of the frame assembly receiving area.

The second guide member can be movable along the first cross-sectional dimension from a radially outward position in the expanded configuration to radially inward position in the contracted configuration. When in the contracted position, the first and second guide members can engage with the frame assembly on substantially opposite sides of the frame assembly receiving area so as to prevent further positional adjustment along the first cross-sectional dimension. The position of the first and second guide members in the contracted configuration can be known or determined, for example by calibration or by computation. In the contracted configuration, the first and second guide members can confine the translational position of the frame assembly to the target position along the first cross-sectional dimension. Optionally, when in the contracted configuration, the first and second guide members can also confine the rotational position of the frame assembly to the target position. The first and second guide members can be arranged at obtuse angles to each other around the frame assembly receiving area. The first and second guide members can be substantially diametrically opposing (e.g. about 180°) across the frame assembly receiving area. When in the expanded configuration, the distance between the first and second guide members can be in the range of from the minimum diameter of the frame assembly to be aligned to the maximum diameter of the frame assembly to be aligned.

The first guide member can comprise an elongate paddle. The second guide member can comprise an elongate paddle. The first and second guide members can each comprise an elongate paddle.

In use, an elongate paddle can help to align the rotational position of the frame assembly. For example, if an elongate paddle engages with a straight edge of the frame assembly, the movement of the paddle can cause the frame assembly to rotate until the straight edge of the frame assembly is fully aligned with the elongate paddle. The first guide member can comprise an elongate paddle having a guide surface. The guide surface of the first guide member can be substantially orthogonal to the direction in which the first guide member is movable (e.g. along the first cross-sectional dimension). The second guide member can comprise an elongate paddle having a guide surface. The guide surface of the second guide member can be substantially orthogonal to the direction in which the second guide member is movable (e.g. the first cross-sectional dimension). The guide surface of the first elongate paddle can be substantially parallel to the guide surface of the second elongate paddle. The first guide member can have a width in the range of 40-150 mm. The second guide member can have a width in the range of 40-150 mm. The width of the first and second guide members can be the same.

The plurality of guide members can comprise a third guide member movable from the expanded configuration to the contracted configuration so as to reduce the second cross-sectional dimension of the frame assembly receiving area.

The third guide member can be movable (e.g. slidable) along the second cross-sectional dimension (or second axis) from a radially outward position in the expanded configuration to a radially inward position in the contracted configuration. The third guide member can be movable in a direction that is substantially orthogonal to the direction in which first guide member is movable.

When the third guide member moves from the expanded configuration to the contracted configuration while the at least one support is supporting the frame assembly, the third guide member can engage with the frame assembly thereby adjusting the translational and optionally the rotational position of the frame assembly into alignment with the target position. For example, the third guide member can adjust the translational position of the frame assembly in a direction along the second cross-sectional dimension.

The first and third guide members can be disposed at about 90° or more to each other around the frame assembly receiving area. The second and third guide members can be disposed on substantially opposite sides of the frame assembly receiving area (e.g. more than 90° to each other around the frame assembly receiving area). The plurality of guide members can comprise a fourth guide member, wherein the third and fourth guide members are disposed on substantially opposite sides of the frame assembly receiving area. The first and fourth guide members can be disposed on substantially opposite sides of the frame assembly.

The fourth guide member can be a stop member, which can prevent further adjustment of the frame assembly in the direction of movement of the third guide member (e.g. along the second axis).

The fourth guide member can be movable from the expanded configuration to the contracted configuration to reduce the second cross-sectional dimension of the frame assembly receiving area.

The fourth guide member can be movable with components along the first and/or second cross-sectional dimensions between a radially outward position and a radially inward position. The fourth guide member can be movable along the second cross-sectional dimension from a radially outward position in the expanded configuration to radially inward position in the contracted configuration. When in the contracted position, the third and fourth guide members can engage with the frame assembly on substantially opposite sides of the frame assembly receiving area so as to prevent further positional adjustment along the second cross-sectional dimension. The position of the third and fourth guide members in the contracted configuration can be known or determined, for example by calibration or by computation. In the contracted configuration, the third and fourth guide members can confine the translational position of the frame assembly to the target position along the second cross-sectional dimension. Optionally, when in the contracted configuration the third and fourth guide members can also confine the rotational position of the frame assembly to the target position. The third and fourth guide members can be arranged at obtuse angles to each other around the frame assembly receiving area. For example, the third and fourth guide members can be at 110-160°, 120-150°, 130-140° or about 135° to each other around the frame assembly receiving area. Alternatively, the third and fourth guide members can be substantially diametrically opposing (e.g. about 180°) across the frame assembly receiving area.

The plurality of guide members can be arranged so that a part of a perimeter of the frame assembly receiving area does not comprise any guide members. The part of the frame assembly receiving area that does not comprise any guide members can be an open region. The open region can be a part of the perimeter of the frame assembly receiving area in the range of 110–160°, 120-150°, 130-140° or about 135° around the frame assembly receiving area. The open region can provide an opening through which an end effector of a transfer robot can travel to load and unload a frame assembly onto and from the alignment device.

The third guide member can be an elongate paddle or a cylinder having a guide surface. The fourth guide member can be an elongate paddle or a cylinder having a guide surface. In use, an elongate paddle can help to align the rotational position of the frame assembly. The guide surface of the third elongate paddle can be substantially parallel to the guide surface of the fourth elongate paddle. Alternatively, the guide surface of the third guide member can be at about 45° to the guide surface of the fourth guide member. The width of the third guide member can be less than the width of the first and/or second guide members. The width of the fourth guide member can be less than the width of each of the first, second and third guide members.

The first cross-sectional dimension of the frame assembly receiving area in the contracted configuration can be shorter than the first cross-sectional dimension of the frame assembly receiving area in the expanded configuration by a distance in the range of 5-30 mm, 6-20 mm, or 7.5-15 mm.

The second cross-sectional dimension of the frame assembly receiving area in the contracted configuration can be shorter than the second cross-sectional dimension of the frame assembly receiving area in the expanded configuration by a distance in the range of 5-30 mm, 6-20 mm, or 7.5-15 mm.

Each of the guide members in the at least three guide members that are movable can be movable by a distance in the range of 5-30 mm, 6-20 mm, or 7.5-15 mm.

The distance of travel of each of the movable guide members can determine the maximum translational and rotational offset that can be corrected by the alignment device.

The plurality of guide members can comprise at least three, optionally at least four, guide members. The at least three guide members can be movable between a radially outward position in the expanded configuration and a radially inward position in the contracted configuration. The at least three guide members that are movable can be radially movable. The term "radially" is used here to mean towards a centre region of the target position. The centre region of the target position can be the centre region of the frame assembly receiving area when the guide members are in the contracted configuration.

In the contracted configuration, each of the guide members plurality of guide members can engage with the frame assembly. For example, the guide members can engage with an outer edge of the frame assembly. In the contracted configuration, the plurality of guide members can clamp the frame assembly.

The at least one support can comprise a plurality of support pins. The plurality of support pins can be arranged to support a frame of the frame assembly. Arranging the at least one support to support the frame can protect the tape of the frame assembly from becoming damaged.

The positioning assembly can further comprise a body. The plurality of guide members can be mountable on the body to define the frame assembly receiving area. The at least one support can be mountable on the body of the positioning assembly so that when the frame assembly is supported on the at least one support, the frame assembly is spaced apart from the body. The at least one support can provide a support surface above an upper surface of the body of the positioning assembly. Providing a space between the frame assembly and the body can allow an end effector of a transfer robot to be positioned in this space without displacing the position of the frame assembly. This can facilitate unloading the frame assembly from the alignment device.

The body can comprise a core and arms extending radially outwardly from the core. The arms are a plurality of arms. The plurality of guide members can be mountable on the arms to define the frame assembly receiving area.

The at least one support can be mounted on the arms so that when the frame assembly is supported on the at least one support, the frame assembly is spaced apart from the arms. Spacing the frame assembly apart from the arms can allow a transfer robot to be positioned between the frame assembly and the arms without displacing the position of the frame assembly. This can facilitate unloading the frame assembly from the alignment device. Each of the arms can carry a guide member and a support, such as a support pin. The guide member and support carried by the same arm can move in unison when changing between the expanded and contracted configurations.

At least one guide member of the plurality of guide members can be mountable on the body at a plurality of radially different locations, optionally along the arms.

The actuating assembly can comprise a cam in communication with the plurality of guide members. The cam can be rotatable so as to change the at least three guide members from the expanded configuration to the contracted configuration. A cam provides a reliable and repeatable mechanism for controlling the position of each of the guide members. The cam can be in communication with each guide member in the plurality of guide members via a plurality of rods extending radially outwardly from the cam.

A biasing means can bias the plurality of guide members towards the contracted configuration. The biasing means can be a spring, such as an extension spring. The biasing means can help to ensure the movable guide members can move between radially outward positions in the expanded configuration and radially inward positions in the contracted configuration.

A part of the actuating assembly can extend through a wall (e.g. a bottom wall) of the transport vacuum chamber via a vacuum feedthrough. The vacuum feedthrough enables the positioning assembly to be operated via the actuating assembly by a controller that is disposed outside of the transport vacuum chamber whilst maintaining vacuum integrity. The vacuum feedthrough may comprise a vacuum seal to the wall of the transport vacuum chamber.

The alignment device can further comprise a base for attaching the alignment device to a bottom wall of a transport vacuum chamber. The positioning assembly can be raised and lowered relative to the base. The base can form a vacuum seal with the bottom wall of the chamber. The base can comprise the vacuum feedthrough.

The positioning assembly can be movable between a raised position and a lowered position relative to a bottom wall of the transport vacuum chamber.

The positioning assembly can be movable between the raised and lowered positions by a distance in the range of 10-100 mm, 25-75 mm, 30-50 mm, or about 40 mm.

Lowering the positioning assembly can provide at least two advantages. Firstly, when a transfer robot is positioned between the frame assembly and the positioning assembly (e.g. the arms) and under the frame assembly receiving area, the frame assembly can be lowered onto the transfer robot whilst maintaining good alignment of the frame assembly. Secondly, when the positioning assembly has been lowered, the transfer robot can move without obstruction between a cassette and the transport vacuum chamber.

The transport vacuum chamber can further comprise at least one auxiliary frame support for supporting the frame assembly when the positioning assembly is in the lowered position. The auxiliary frame support can comprise a plurality of support pins, optionally upstanding from the base. The auxiliary frame support can be arranged to support the frame of the frame assembly. The auxiliary frame support can provide support to the frame of the frame assembly so as to protect the tape of the frame assembly from becoming damaged when the positioning assembly is lowered. The auxiliary frame support can provide a support surface lower than a support surface of the at least one support.

The transport vacuum chamber can further comprise an orientation adjuster for rotating the positioning assembly, optionally by an angle of $\pm 1\text{-}3°$, or $\pm 1°$. The orientation adjuster can allow the rotational position of the target position to be fine tuned about an axis perpendicular to the plane of the frame assembly receiving area (e.g. a vertical axis).

The transport vacuum chamber can comprise a plurality of alignment devices.

According to a second aspect of the invention, there is provided a transport vacuum chamber for handling a frame assembly under vacuum conditions comprising:

an alignment device for adjusting a translational and rotational position of the frame assembly into alignment with a target position within the transport vacuum chamber; and a transfer robot disposed within the transport vacuum chamber for transferring the frame assembly onto the alignment device;

wherein the alignment device comprises:

a positioning assembly disposed within the transport vacuum chamber comprising a plurality of guide members that are arranged to define a frame assembly receiving area within the transport vacuum chamber;

at least one support for supporting the frame assembly in the frame assembly receiving area; and an actuating assembly operable to change the plurality of guide members from an expanded configuration to a contracted configuration so as to reduce a first cross-sectional dimension of the frame assembly receiving area and to reduce a second cross-sectional dimension of the frame assembly receiving area that is perpendicular to the first cross-sectional dimension;

wherein when the plurality of guide members change from the expanded configuration to the contracted configuration while the frame assembly is supported on the at least one support, the plurality of guide members engage with the frame assembly so as to adjust the translational and/or rotational position of the frame assembly into alignment with the target position.

The vacuum cassette elevator load lock typically house a vertically stacked multi-wafer cassette. A multi-wafer cassette can retain a plurality of frame assemblies in a vertical stack arrangement. The cassette can be vertically movable within the vacuum chamber of the VCE load lock so that, for example, the cassette can be moved into alignment with a slot valve. Providing the VCE load lock in vacuum communication with the transport vacuum chamber, for example via a slot valve, avoids the requirement of a separate load lock to pressurise and depressurise the frame assembly, such as is required with a FOUP system. This can significantly reduce tool cost of manufacture, cost of ownership, tool footprint, and improve throughput. Providing the positioning assembly of the alignment device within the transport vacuum chamber provides an efficient and reliable means of improving the frame assembly alignment. This can reduce mishandling events whilst maintaining vacuum conditions.

According to a third aspect of the invention there is provided a method of adjusting a translational and rotational position of a frame assembly into alignment with a target position under vacuum conditions using a transport vacuum chamber according to the second aspect of the invention, the method comprising the steps of:
(a) configuring the plurality of guide members into the expanded configuration;
(b) positioning the frame assembly onto the at least one support in the frame assembly receiving area;
(c) changing the plurality of guide members from the expanded configuration to the contracted configuration so that the at least three guide members engage with the frame assembly so as to adjust the translational and/or rotational position of the frame assembly into alignment with the target position.

The frame assembly comprises a wafer positioned on a frame. The wafer can be a semiconductor wafer, such as a silicon wafer. The frame assembly can be of the type comprising at least one pair of parallel diametrically opposed straight edges. The plurality of guide members can engage with at least the pair of parallel diametrically opposed straight edges.

Each of the plurality of guide members can be engaged with the frame assembly in the contracted configuration.

The method can further comprise a step of unloading the frame assembly from the support by:
i. changing the plurality of guide members from the contracted configuration into the expanded configuration;
ii. positioning a part (e.g. an end effector) of the transfer robot between the frame assembly and the positioning assembly; and
iii. lowering the positioning assembly so that the frame assembly is lowered onto the end effector of the transfer robot.

Positioning the end effector between the frame assembly and the positioning assembly (e.g. the body or arms of the positioning assembly) can allow the frame assembly to be unloaded from the alignment device whilst keeping the frame assembly in the target position.

The method according to the third aspect can be performed prior to loading the frame assembly into a cassette vacuum chamber, such as a vacuum cassette elevator (VCE) load lock. For example, the method can be performed prior to loading the frame assembly into a cassette, such as a multi-wafer cassette, housed within the cassette vacuum chamber. The method according to the third aspect can be performed prior to loading the frame assembly into a wafer processing module.

According to a fourth aspect of the invention, there is provided a method of handling a frame assembly under vacuum conditions using the wafer processing system according to the first aspect, the method comprising the steps of:
providing a frame assembly on the transfer robot that is disposed within the transport vacuum chamber;
transferring the frame assembly from the transfer robot onto the alignment device;
aligning the translational and rotational position of the frame assembly into alignment with the target position using the alignment device; and
subsequently transferring the frame assembly from the alignment device to the at least one cassette vacuum chamber or to the at least one wafer processing module.

The step of aligning the translational and rotational position of the frame assembly can be performed using the method according to the third aspect.

Whilst the invention has been described above, it extends to any combination of the features set out above, or in the following description, drawings and claims. For example, any features disclosed in relation to one aspect of the invention may be combined with any features of any of the other aspects of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
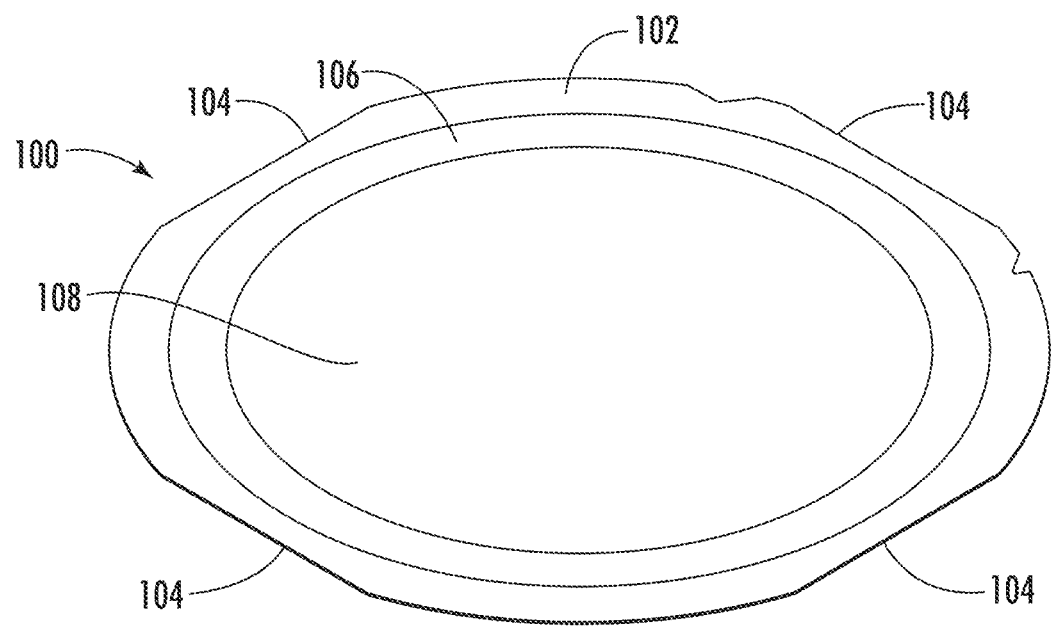
FIG. 1 is a perspective view of a frame assembly.

FIG. 1 shows a typical frame assembly 100 used in semiconductor processing methods, such as plasma dicing. The frame assembly 100 comprises a frame 102 having a substantially annular shape. The outer perimeter of the frame 102 is substantially circular. However, the outer perimeter of the frame 102 comprises four straight edges 104, which are arranged as two pairs of substantially diametrically opposed parallel straight edges. Adjacent straight edges 104 are substantially perpendicular to each other. The diameter of the frame assembly 100 therefore varies depending on the angle of measurement, with the shortest diameter being between opposite straight edges 104. Typically, the four straight edges 104 are about the same length. The length of each of the four straight edges 104 can be about 100-150 mm for a frame assembly suitable for carrying a 300 mm wafer; or about 50-100 mm for a frame assembly suitable for carrying a 200 mm wafer. The shape and size of frames (and corresponding cassettes) can be determined by industry standards (e.g. SEMI G74-0699 provides the specification for a tape frame for 300 mm diameter wafers), although variations in these standards may be contemplated.

The frame 102 is typically covered with an adhesive tape 106, typically made from a plastic material, which is tolerant to plasma processing conditions (e.g. plasma dicing conditions). The wafer 108 to be processed is placed centrally onto the adhesive tape 106. The frame assembly 100 can be of various sizes depending on the size of the wafer 108 to be processed. For example, a 400 mm diameter frame assembly can typically carry a wafer having a diameter of up to about 300 mm. As a further example, a 296 mm diameter frame assembly can typically carry a wafer having a diameter of up to about 200 mm. Other sizes may be contemplated. It is envisaged that a number of small wafers, such as compound semiconductor wafers, could be adhered to the tape within the inner diameter of the annular frame.

Figure 2:
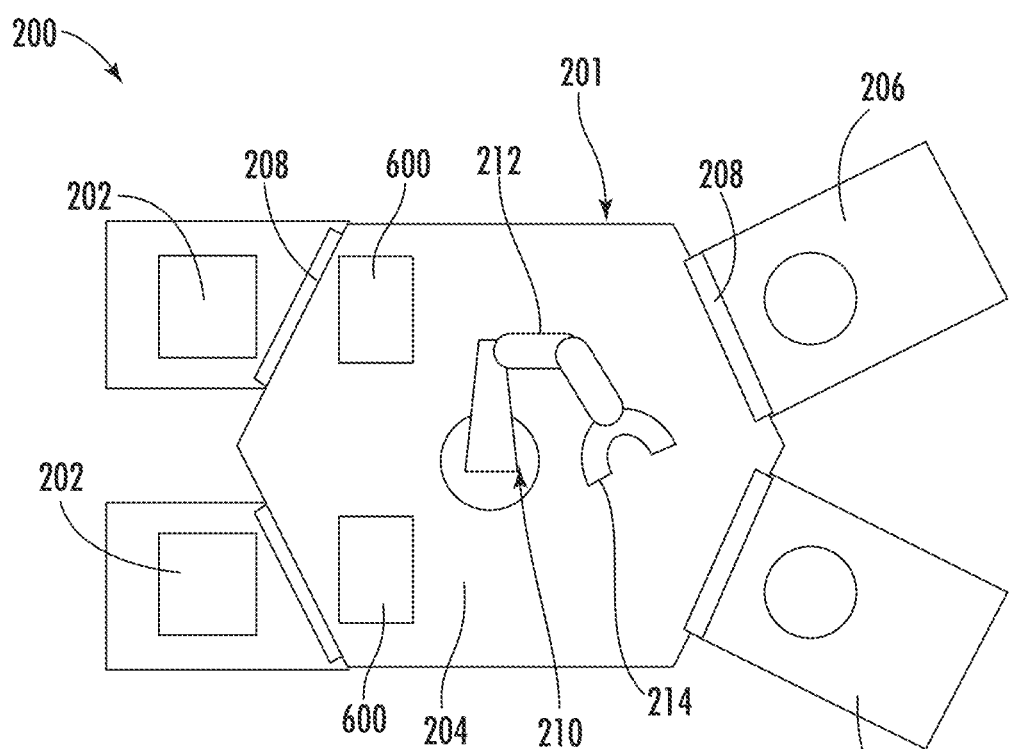
FIG. 2 is a schematic plan view of a wafer processing system.

FIG. 2 shows a wafer processing system 200 according to an embodiment of the present invention. The system 200 comprises at least one cassette vacuum chamber 202; an apparatus 201 comprising at least one alignment device 600 disposed in a transport vacuum chamber 204; and one or more wafer processing modules 206. The processing modules 206 can be plasma dicing modules. By way of example only, the wafer processing system 200 can have one alignment device 600, or two alignment devices 600.

Figure 3:
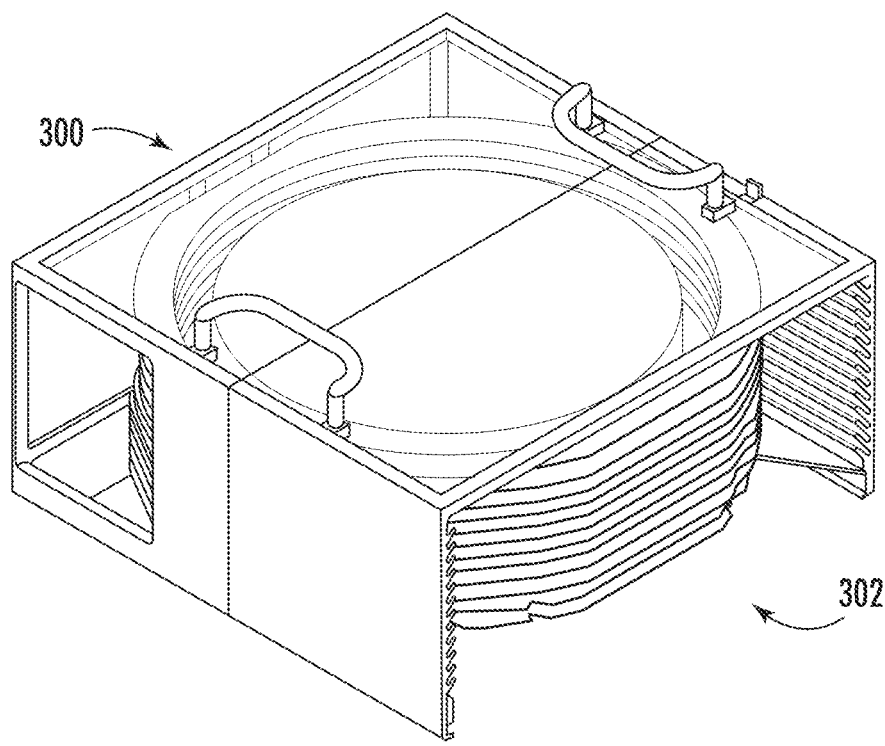
FIG. 3 is a perspective view of a multi-wafer cassette.

The cassette vacuum chamber 202 can house a cassette, such as a multi-wafer cassette, for example, the multi-wafer cassette 300 shown in FIG. 3 can hold up to 13 frame assemblies. The cassette vacuum chamber 202 is typically a vacuum cassette elevator (VCE) load lock. In use, a cassette vacuum chamber, such as a VCE load lock, is maintained under vacuum conditions. Using a cassette vacuum chamber (e.g. a VCE load lock) avoids the need for a load lock between an atmospheric cassette or FOUP and the transport vacuum chamber, which is held under vacuum. A system 200 that does not require a load lock between the cassette and the transport module can have a reduced tool footprint, increased wafer throughput as the cassette containing a number of wafers are all evacuated at the same time and once vacuum is achieved are continually available to the vacuum robot, and reduced cost of manufacture. These benefits can be achieved using a VCE load lock. However, when using a VCE load lock, a frame assembly alignment step performed under vacuum conditions is preferred to reduce the frequency of mishandling events when returning the frame assembly to the cassette.

Figure 4:
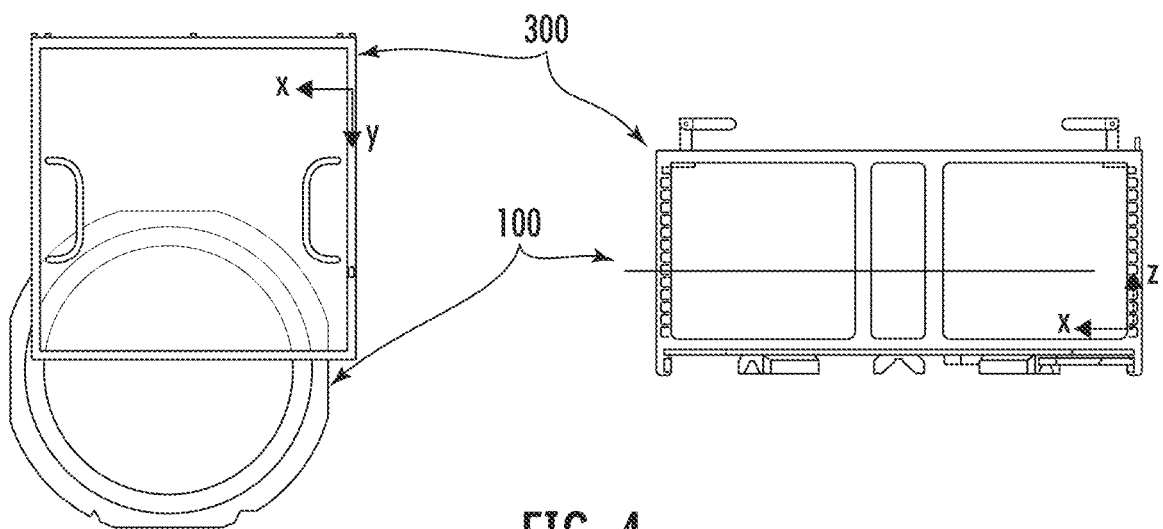
FIG. 4 is a plan view and a front view of a translational misalignment.

A mishandling event can occur due to a translational misalignment or a rotational misalignment when loading a frame assembly into a cassette housed within a cassette vacuum chamber, such as a VCE load lock. FIG. 4 shows a plan view and a front view of a translational misalignment, wherein the frame assembly is laterally displaced along an x axis. The lateral misalignment will prevent the frame assembly 100 from being inserted into the cassette 300, and a mishandling event will occur. In general, the centre of the frame assembly must be within a tolerance of about ±1.5 mm from the midpoint of the cassette in both the x and y axes for the frame assembly to be successfully inserted into the cassette, and thereby avoiding a mishandling event. When the frame assembly is optimally aligned, the clearance between the outer edge of frame assembly and the cassette is typically about 1.5 mm.

Figure 5:
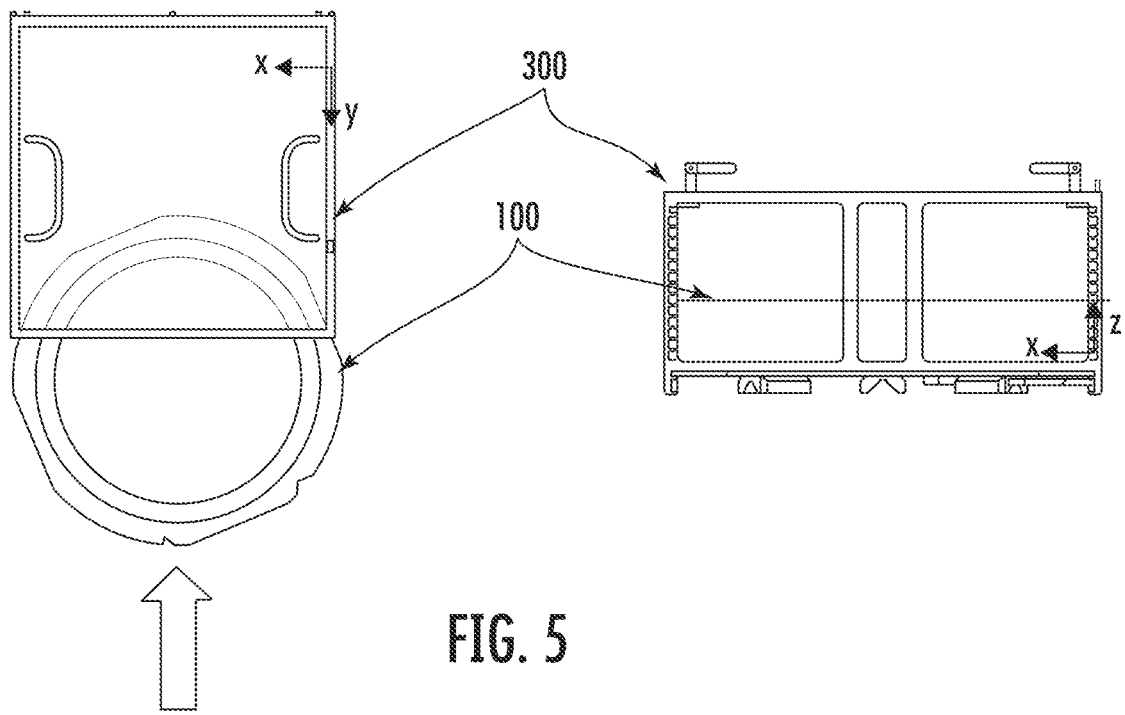
FIG. 5 is a plan view and a front view of a rotational misalignment.

FIG. 5 shows a plan view and a front view of a rotational misalignment. The diameter of the frame assembly 100 is variable depending on the angular orientation in which the diameter is measured. That is, the frame assembly 100 is asymmetrical about an axis of rotation (i.e. about the z axis as shown in FIG. 5). Therefore, it is necessary to ensure the frame 102 has the correct rotational alignment to enable the frame assembly 100 to be successfully inserted into the cassette 300 without a mishandling event occurring. In general, the rotational alignment must be within a tolerance of about ±1°.

The apparatus 201 comprising the alignment device 600 of the present disclosure is suitable for performing a frame assembly alignment step under vacuum conditions.

The transport vacuum chamber 204 is typically maintained under vacuum at a low pressure, for example, a pressure of less than about 100 Torr. A slot valve 208 allows a frame assembly 100 to be transported into and out of the transport vacuum chamber 204 from a cassette housed within the cassette vacuum chamber 202 whilst maintaining the respective pressures in the transport vacuum chamber 204 and the cassette vacuum chamber 202. The alignment device 600 and the opening of the cassette 302 are typically aligned on opposite sides of the slot valve 208.

A transfer robot 210 is disposed in the transport vacuum chamber 204. The robot 210 comprises a robot arm 212 and an end effector 214. The robot 210 transfers a frame assembly 100 between the cassettes housed in the cassette vacuum chamber 202, the at least one alignment device 600, and the processing modules 206. The frame assembly can be transferred between any of these components in any sequence as desired. For example, the robot 210 can transfer the frame assembly 100 from a cassette 202, to one of the processing modules 206, and then subsequently to one of the alignment devices 600 before returning the frame assembly to the cassette 202. The robot 210 can also transfer the frame assembly 100 from one processing module 206 to another processing module.

Figure 6:
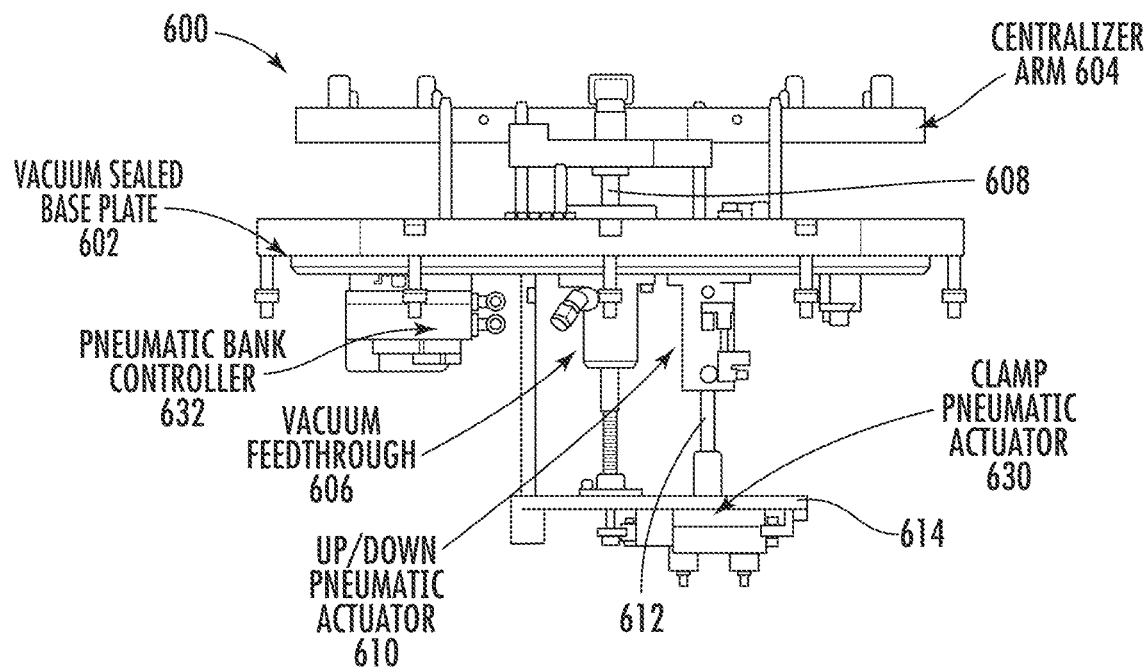
FIG. 6 is a side view of an alignment device.
Figure 7:
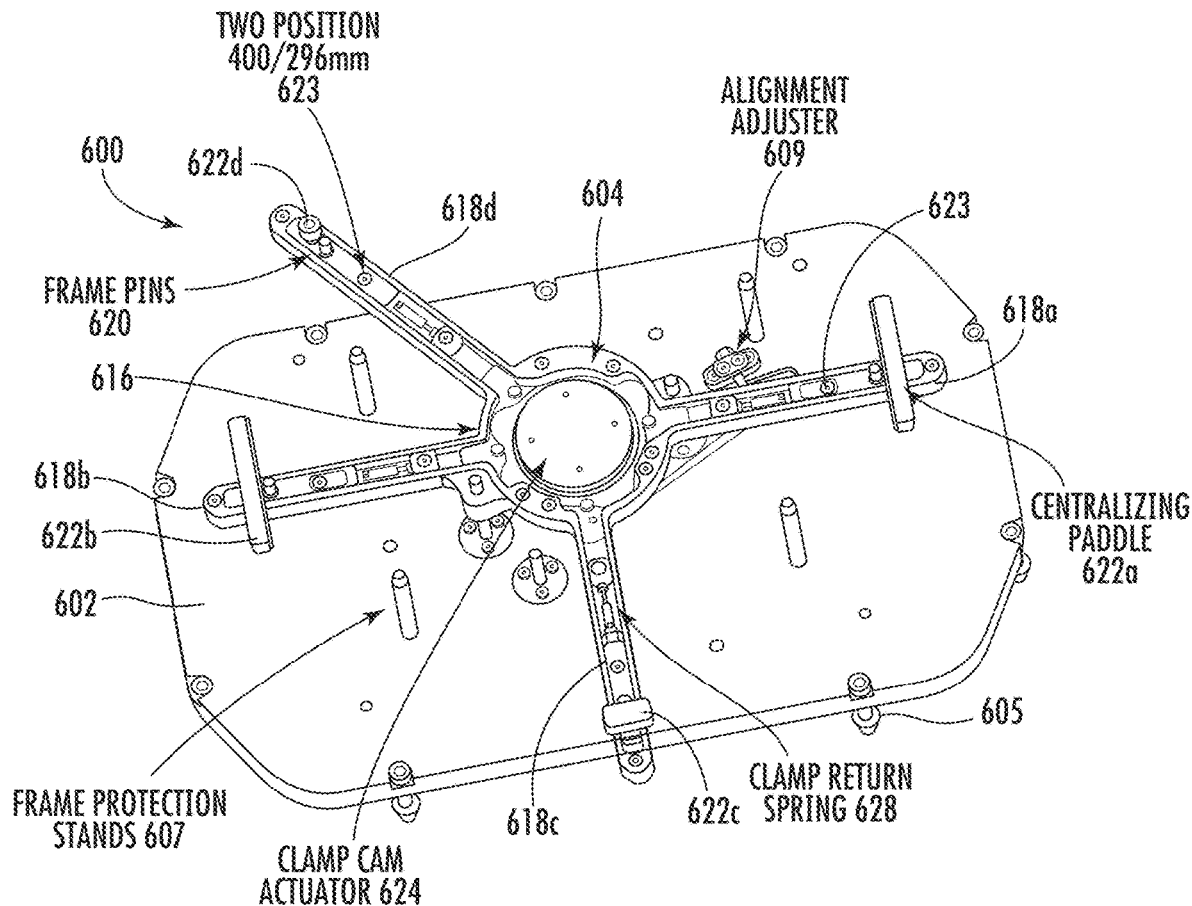
FIG. 7 is a view of an alignment device.
Figure 8:
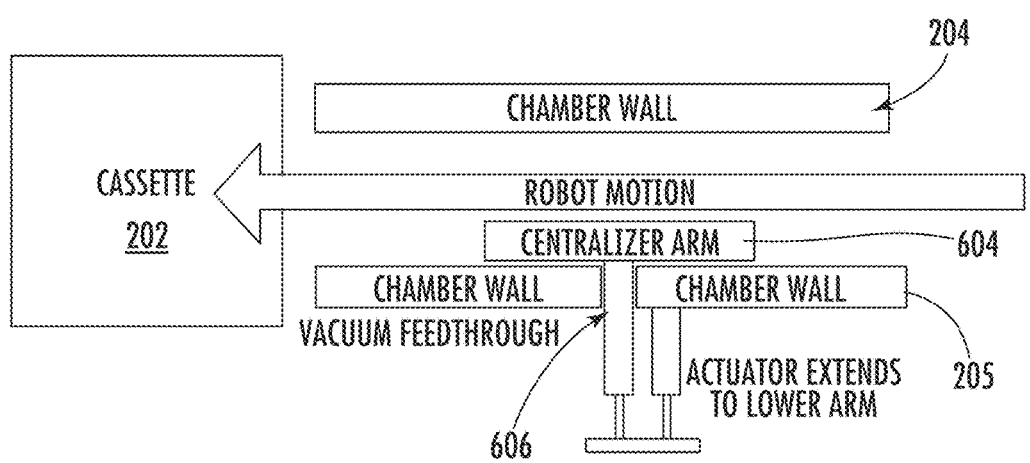
FIG. 8 is a schematic cross-sectional view of an alignment device in a lowered position.
Figure 9:
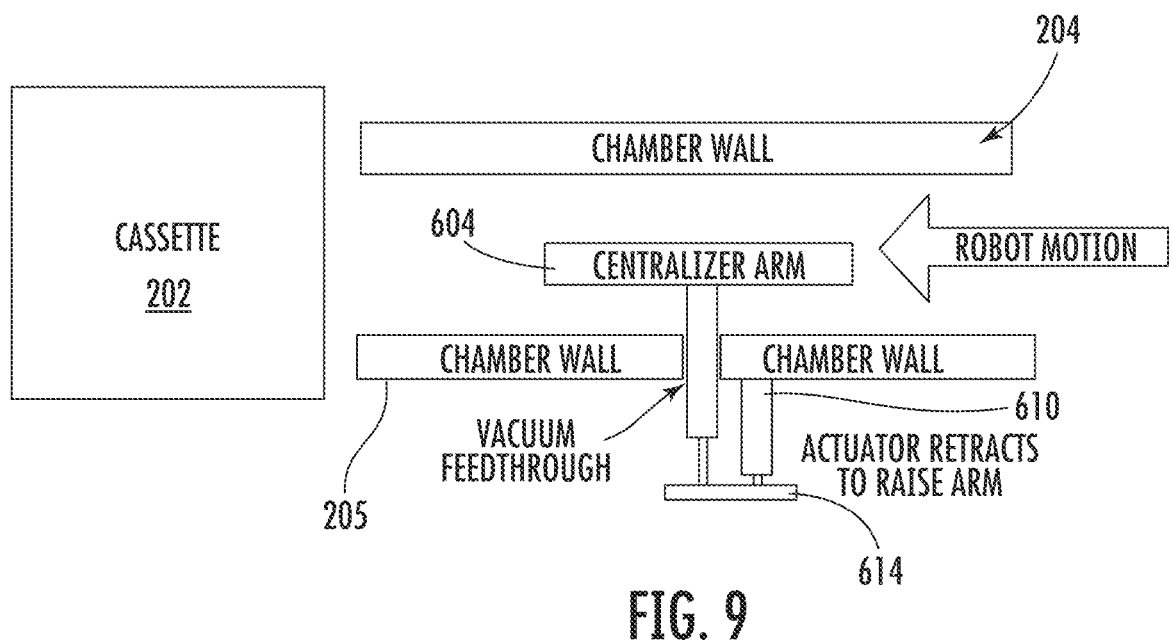
FIG. 9 is a schematic cross-sectional view of an alignment device in a raised position.

FIGS. 6 and 7 show views of an alignment device 600. The alignment device 600 is suitable for aligning a translational and rotational position of a frame assembly 100 with a target position. The target position is the desired translational and rotational position of the frame assembly 100 on the alignment device 600 after the frame assembly 100 has been aligned. Positioning the frame assembly 100 in the target position can significantly reduce the prevalence of mishandling events occurring. The alignment device 600 comprises a base 602 and a positioning assembly 604. In use, the base 602 and the positioning assembly 604 are disposed within the transport vacuum chamber 204. The base 602 is fixed to the inner surface of the bottom wall of the transport vacuum chamber 204, for example, using a plurality of bolts 605. There is a vacuum seal between the base 602 and the walls of the transport vacuum chamber 204. The alignment device 600 further comprises a series of actuators that are situated outside of the transport vacuum chamber 204. The actuators control the operation of the alignment device 600. The base 602 comprises a vacuum feedthrough 606 so that the actuators can control the parts of the alignment device 600 that are inside the chamber 204 whilst maintaining the high level of vacuum within the transport vacuum chamber 204. The base further comprises frame protection stands (also referred to as auxiliary frame supports) 607. The vacuum feedthrough 606 extends through a wall 205 in the transport vacuum chamber (as shown in FIGS. 8 and 9).

The positioning assembly 604 is carried on a shaft 608. The orientation of the positioning assembly 604 can be fine tuned using the orientation adjuster 609. Typically, the orientation adjuster 609 can rotate the positioning assembly 604 by about ±1-3 degrees, or by about ±1 degree (about the vertical axis). The positioning assembly 604 is vertically movable between a lowered position and a raised position. In the lowered position (shown schematically in FIG. 8), the positioning assembly 604 does not obstruct the movement of the robot arm 212. Therefore, the robot arm 212 can travel freely to and from the cassette vacuum chamber (through the slot valve 208) without obstruction. In the raised position (shown in FIG. 9), the robot 210 can offload a frame assembly to be aligned onto the positioning assembly 604. The distance between the raised and lowered positions can be in the range of 20 mm to 100 mm, 30 mm to 75 mm, or 40 mm to 50 mm (or any combination of these upper and lower limits). To load a frame assembly 100 onto the positioning assembly 604, an end effector carrying the frame assembly 100 is placed onto the positioning assembly 604 when the positioning assembly is in the raised position. The end effector can then be removed. Alternatively, the positioning assembly 604 can be raised with the transfer robot 210 in an appropriate position so that frame assembly 100 is loaded onto the positioning assembly 604.

To unload the frame assembly 100 from the positioning assembly 604, the positioning assembly 604 can be lowered from the raised position to the lowered position while the end effector 214 is positioned between the frame assembly 100 and the positioning assembly 604 so that the frame assembly is lowered onto the end effector 514. This method can help to maintain the alignment of the frame assembly when transferring the frame assembly to the transfer robot 210.

The vertical movement of the positioning assembly 604 is controlled by a first actuator 610. The first actuator 610 is typically a pneumatic actuator. However, alternative types of actuator, such as an electronic actuator, can be used. The first actuator 610 is disposed outside of the vacuum chamber 204, and comprises a piston 612 that is extendable to control the vertical position of the positioning assembly 604. In the embodiment shown in FIGS. 6 and 7, the piston 612 is coupled to the shaft 608 via a plate 614 so that as the piston 612 extends, the shaft 608 moves in unison. Consequently, as the piston 612 extends downwards, the shaft 608 also moves downwards, and the positioning assembly 604 is lowered accordingly. The vacuum feedthrough 606 enables this vertical movement to occur whilst maintaining vacuum integrity.

The positioning assembly 604 comprises a body having a core 616 and a plurality of arms extending outwardly therefrom. The example shown in FIG. 7 comprises four arms 618a-d. However, more or fewer arms may be provided in alternative embodiments. The arms 618a-d extend radially outwardly from the core 616 in a horizontal plane (e.g. an x-y plane). The first and second arms 618a-b are arranged to extend radially outwardly from the core 616 along a common first coordinate axis (e.g. an x-axis) but in opposite directions. The third arm 618c is arranged to extend radially outwardly from the core 616 in a direction that is perpendicular to the first coordinate axis. That is, the third arm 618c extends along a second coordinate axis (e.g. a y-axis). The fourth arm 618d extends radially outwardly from the core in the x-y plane but at an angle of more than 90° but less than or equal to 180° from the third arm 618c. In the example shown in FIG. 7, the angle between the third and fourth arms is about 135°. Additionally, the angle between the first and fourth arms is about 135°. This provides an open region (of about 135°) around the frame assembly which does not comprise any guide members. Such an open region can beneficially provide an opening through which the transfer arm of the robot 210 can enter to load and unload the frame assembly 100 onto and from the alignment device 600. The invention is not limited by the exemplified distribution and arrangement of the arms 618a-d.

Each arm 618a comprises a frame support structure. In the example shown in FIG. 7, the frame support structure is in the form of four frame support pins 620 (only one of which is labelled for clarity). The frame support pins 620 are upstanding from the arms 618a-d. The frame support pins 620 are arranged so as to support the frame 102 of a frame assembly 100. The frame support structures could have alternative geometries and sizes. For example, the frame support structure could be a single piece support. The support can have gaps to allow the end effector to be inserted between the frame assembly 100 and the arms 618a-d.

Each arm 618a-d further comprises a rod carrying a guide member 622a-d. The guide members 622a-d are typically secured in a complementary socket 623 in the rod. The rod can comprise a plurality of such sockets 623 to allow a user to vary the position of the guide members 622a-d radially along each arm 618a-d. This allows frame assemblies of different sizes and diameters to be aligned using the same alignment device 600. This saves processing time and expense because additional hardware is not required. This significantly increases the utility of the alignment device 600.

The plurality of guide members 622a-d are arranged so as to substantially correspond to the shape of a frame assembly 100. The plurality of guide members 622a-d define a frame assembly receiving area. At least some of or all of the guide members 622a-d are movable to vary the size of the frame assembly receiving area. Each of the movable guide members has a radially outward position and a radially inward position. The plurality of guide members has an expanded configuration in which each of the movable guide members are in the radially outward positions. In the expanded configuration, the frame assembly receiving area is sized to permit a frame assembly 100, such as a 400 mm or 296 mm diameter frame assembly, to be placed within the frame assembly receiving area. The plurality of guide members has a contracted configuration in which each of the movable guide members are in the radially inward positions. In the contracted configuration, the guide members 622a-d define a perimeter of the target position. The area defined by the guide members 622a-d in the expanded configuration is larger than the area defined by the guide members 622a-d in the contracted configuration.

The movable guide members can move so as to vary perpendicular first and second cross-sectional dimensions of the frame assembly receiving area. For example, when changing from the expanded configuration to the contracted configuration, the first and second cross-sectional dimensions are decreased, thereby reducing the area of the frame assembly receiving area. The first cross-sectional dimension can correspond to a first coordinate axis (e.g. x axis). The second cross-sectional dimension can correspond to a second coordinate axis (e.g. y axis).

The guide members 622a and 622b are of the form of elongate paddles. The guide members 622a and 622b are diametrically opposed across the frame assembly receiving area. The paddles of the guide members 622a and 622b are substantially parallel to each other. The paddles of the guide members 622a and 622b are substantially orthogonal to their direction of movement. The guide member 622c is of the form of a relatively narrower paddle. The paddle of the guide member 622c is substantially orthogonal to its direction of movement. The guide member 622c is substantially perpendicular to the guide members 622a and 622b. The guide member 622d is of the form of a cylinder. The width of the guide members 622a-d is typically less than the width of a straight edge 104 of the frame assembly 100 to be aligned. However, the width of the guide members 622a-d can be greater than the width of a straight edge 104 of the frame assembly 100. The width of each guide member 622a-d can be tailored dependent upon the dimensions of the frame assembly 100 being aligned. The rods can slide in channels along the arms 618a-d thereby permitting the guide members 622a-d to move radially inwards and outwards along the arms 618a-d. For example, the first guide member 622a is movable towards and away from the core 616 along the first coordinate axis (e.g. the x-axis) to vary the first cross-sectional dimension of the frame assembly receiving area; and the third guide member 622c is movable towards and away from the core 616 along the second coordinate axis (e.g. the y-axis) to vary the second cross-sectional dimension of the frame assembly receiving area. The fourth guide member 622d is movable in a direction towards and away from the core 616 along the fourth arm 618d. For example, the fourth guide member 622d is movable in a direction that has a component along the y-axis and a component along the x-axis so as to vary the first and second cross-sectional dimensions of the frame assembly receiving area. Each guide member has a travel distance, for example along the respective arm, of between 3-20 mm, 5-15 mm, 7-10 mm or about 7.5 mm. Therefore, in the exemplified embodiment, the first cross-sectional dimension of the frame assembly receiving area in the expanded configuration is larger than the first cross-sectional dimension in the contracted configuration by a distance in the range 6-40 mm, 10-30 mm, 14-20 mm, or about 15 mm.

The frame support structures 620 can move in unison with the guide members 622a-d. In alternative embodiments, one or more of the guide members can be static. For example, the fourth guide member can act as a static end stop.

The movement of the guide members 622a-d is controlled by an actuating assembly. The actuating assembly comprises a cam 624 disposed within the core 616. In the embodiment shown in FIG. 7, a biasing means, such as a spring 628, biases the rods towards their most radially inward position. The spring 628 can be an extension spring. Therefore, when the cam lobe is rotated away from the arm 618b, the rod (and hence the guide member 622b) moves radially inwards into the contracted configuration.

In operation, an end effector 214 of a robot 210 picks up a frame assembly 100 from a cassette housed in a cassette vacuum chamber 202 or a processing module 206. The position of the frame assembly 100 on the end effector 214 can be variable or offset. The positioning assembly 604 of the alignment device 600 is moved to its raised position. The cam 624 is actuated so that the guide members 622a-d are in a radially outward position (i.e. the expanded configuration). When the alignment device 600 is in this expanded configuration, the robot 210 can place the frame assembly 100 onto the frame supports, for example, the frame support pins 620. The frame assembly 100 is likely to have a degree of translational and rotational misalignment when initially placed onto the frame supports 620 by the robot 210.

When the frame assembly 100 is supported on the alignment device, the cam 624 is actuated so as to move the guide members 622a-d radially inwards, towards the frame assembly 100. In the embodiment shown in FIG. 7, the guide members 622a-d move in unison. As the guide members 622a-d move radially inwards, the guide members 622a-d will engage with an outer perimeter of the frame assembly 100. In particular, the guide members 622a-c are arranged to engage with the straight edges 104 of the frame 102; and the guide member 622d is arranged engage with a curved edge of the frame 102. The surfaces of the guide members 622a-d that engage with the frame assembly 100 are substantially orthogonal to the direction in which the respective guide member is movable.

In the case of a translational misalignment (i.e. a misalignment in the x-axis and/or the y-axis), the (movable) guide member nearest the frame assembly 100 will engage with the frame assembly first. This guide member will guide the frame assembly into a more central position (i.e. towards the target position) counteracting the original translational misalignment. For example, if the frame assembly 100 is offset towards the first guide member 622a, the movable guide member 622a will engage with the nearest straight edge 104 so as to push the frame assembly 100 towards a more central position. As the guide members 622a and 622b continue to move inwards, eventually the second guide member 622b will contact the frame assembly 100 on substantially the opposite side of the frame assembly receiving area. At this point, the centre of the frame assembly 100 will be aligned along the x-axis so that the centre of the frame assembly substantially corresponds to the midpoint between the first and second guide members 622a, 622b. That is, the frame assembly will be aligned with the target position along the x-axis. The guide members 622c and 622d align the frame assembly 100 along the y-axis in the same manner. This provides the effect of translationally aligning the frame assembly 100 in both the x- and y-directions. The frame assembly 100 can be aligned in both the x- and y-directions concurrently. The maximum initial offset along x-axis that can be corrected can be in the range of ±3-20 mm, ±5-15 mm, ±7-10 mm or about ±7.5 mm. The maximum initial offset along the y-axis that can be corrected can be in the range of ±3-20 mm, ±5-15 m, ±7-10 mm or about ±7.5 mm.

Figure 10:
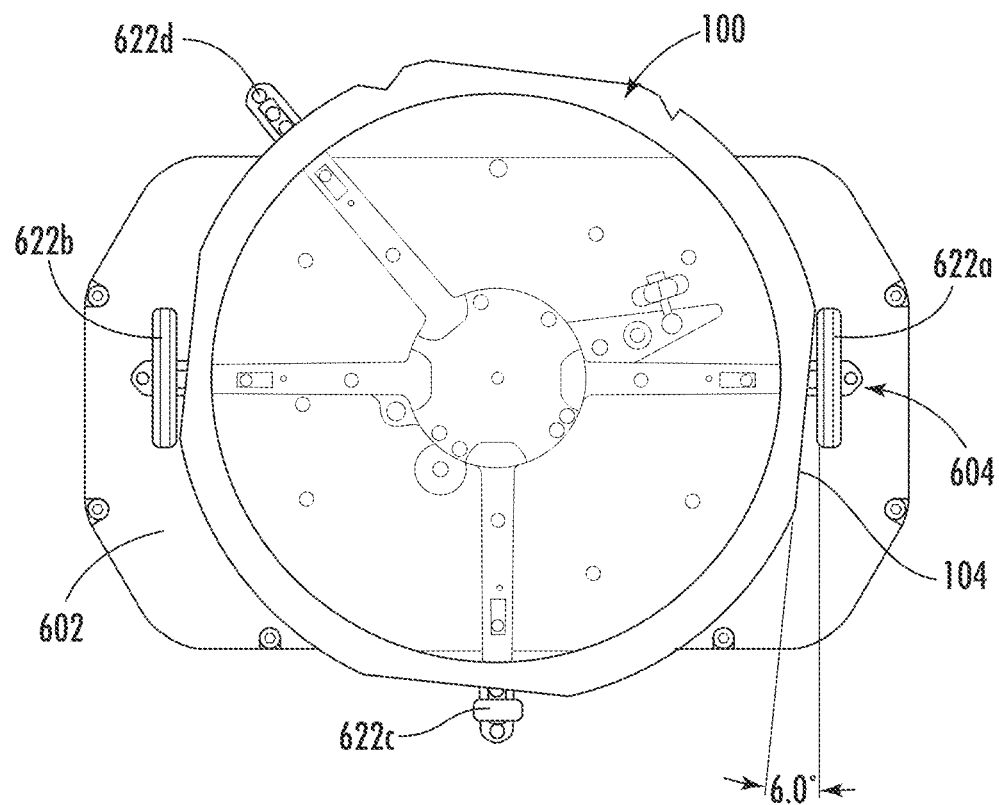
FIGS. 10 and 11 are plan views of a frame assembly being supported on an alignment device.

In the case of a rotational misalignment (shown in FIG. 10), the guide members are operated in the same manner. However, the guide member(s) will initially engage with only a part of the straight edge 104 of the frame assembly. FIG. 10 shows two opposite guide members 622a and 622b at the point of initial engagement in the case of a rotational misalignment (without any translational misalignment). Due to the variance in diameter of the frame assembly 100 at the straight edges 104, if there is a rotational misalignment, one end of the guide member 622a, 622b will engage with the straight edge 104 of the frame assembly 100 before the centre of the guide member is engaged. Consequently, as the guide members 622a-d move radially inwardly, a torque is applied to the frame assembly 100, which acts to correct the rotational misalignment. This torque can be applied by one guide member (e.g. in the case of a rotational and translational misalignment); or by more than one guide member (e.g. in the example shown in FIG. 10).

The torque applied will cause the frame assembly 100 to rotate until the straight edge 104 is fully engaged with the planar guide surface of the guide member. When the straight edge 104 is fully engaged with the guide surface, no further torque is applied. The frame assembly is prevented from over-rotating due to a combination of the orientation of the guide surface of the guide member; the width of the guide member (e.g. the width that extends laterally either side of the arm); and the presence of a further guide member acting at an opposing side of the frame assembly. Providing guide surfaces (e.g. paddles) that are orthogonal to the direction of movement can help to prevent over rotation of the frame assembly 100. Providing a guide member that is mounted at its midpoint on the arm (i.e. has an equal width either side of the arm) can help to prevent over-rotation of the frame assembly 100.

Figure 11:
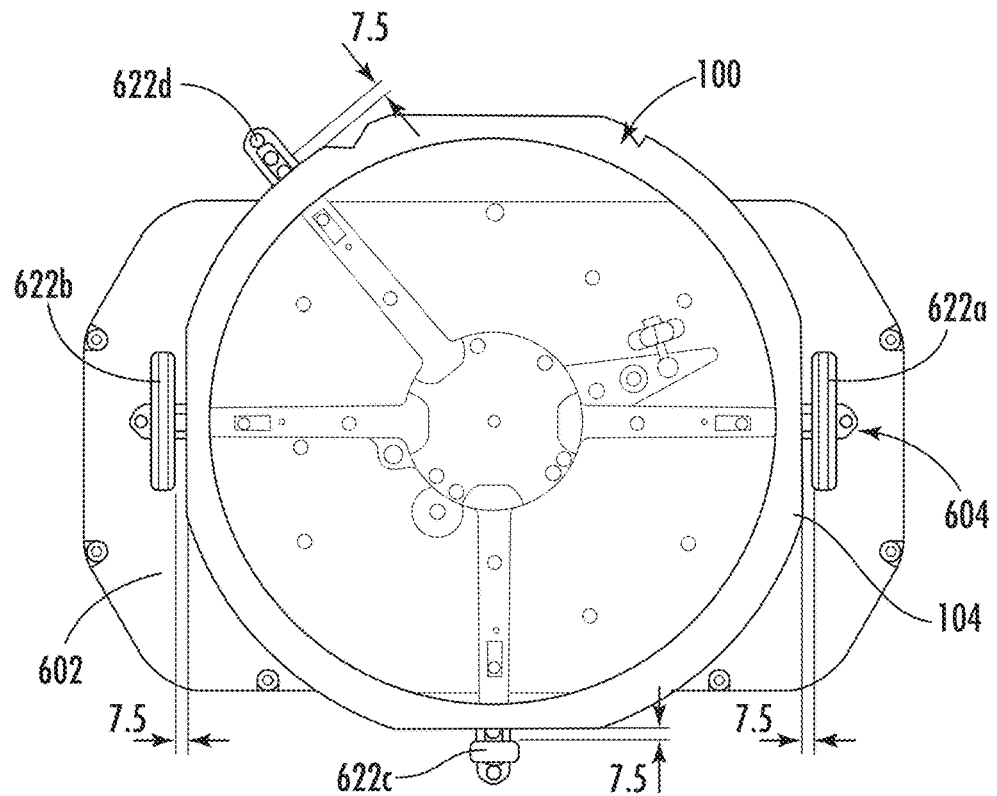
Figure 12:
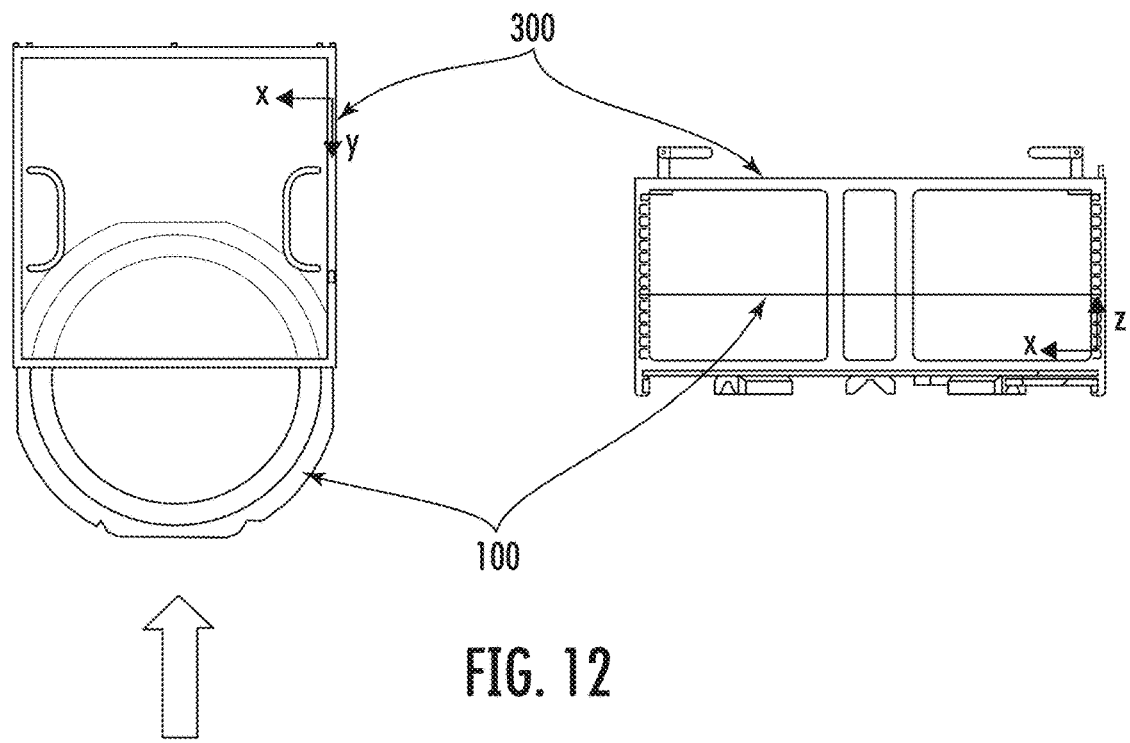
FIG. 12 is a plan view and a front view of a correct alignment.

FIGS. 11 and 12 show a frame assembly 100 on the alignment device 600, wherein the frame assembly 100 is aligned with the target position. FIG. 11 shows the plurality of guide members 622a-d are in the expanded configuration. In the example shown in FIG. 11, the guide members are positioned radially outwardly from the target position by a distance of 7.5 mm. Each of the plurality of guide members 622a-d can move radially through a distance of 7.5 mm.

After the frame assembly 100 has been aligned, the actuating assembly (e.g. the cam 624) moves the plurality of guide members 622a-d back into the expanded configuration. This disengages the guide members 622a-d with the frame assembly 100.

The end effector 214 of the transfer robot 210 can be positioned between the underside of the frame assembly 100 and the top side of the body (i.e. the core 616 and arms 618a-d). More specifically, the end effector 214 is placed in a known position underneath the target position, and is spaced apart from the frame assembly 100. The positioning assembly 604 can then be lowered, which causes the frame assembly 100 to be lowered onto the end effector in a known position. Transferring the frame assembly 100 onto the transfer robot 210 in this way can help to avoid any slide or mal-positioning as the frame assembly 100 is transferred. The transfer robot 210 can subsequently transfer the frame assembly 100 into a cassette housed in a cassette vacuum chamber 202, such as a VCE load lock, or a wafer processing module. Since the translational and rotational position of the frame assembly 100 has been aligned with a known target position, the frame assembly 100 can be transferred into the cassette with a reduced risk of a mishandling event occurring.

What is claimed is:

1. A wafer processing system comprising:
   a transport vacuum chamber for handling a frame assembly under vacuum conditions;
   at least one vacuum cassette elevator load lock for housing a cassette and adjusting a vertical position of the cassette under vacuum conditions, wherein the at least one vacuum cassette elevator load lock is in vacuum communication with the transport vacuum chamber; and
   at least one wafer processing module in vacuum communication with the transport vacuum chamber;
   wherein the transport vacuum chamber comprises:
   an alignment device for adjusting a translational and rotational position of the frame assembly into alignment with a target position within the transport vacuum chamber; and
   a transfer robot disposed within the transport vacuum chamber for transferring the frame assembly between the at least one cassette vacuum chamber, the at least one alignment device, and the at least one wafer processing module under vacuum conditions;
   in which the alignment device comprises:
   a positioning assembly disposed within the transport vacuum chamber comprising a plurality of guide members that are arranged to define a frame assembly receiving area within the transport vacuum chamber;
   at least one support for supporting the frame assembly in the frame assembly receiving area; and
   an actuating assembly operable to change the plurality of guide members from an expanded configuration to a contracted configuration so as to reduce a first cross-sectional dimension of the frame assembly receiving area and to reduce a second cross-sectional dimension of the frame assembly receiving area that is perpendicular to the first cross-sectional dimension;
   wherein when the plurality of guide members change from the expanded configuration to the contracted configuration while the frame assembly is supported on the at least one support, the plurality of guide members engage with the frame assembly so as to adjust the translational and/or rotational position of the frame assembly into alignment with the target position.

2. A wafer processing system according to claim 1, in which the alignment device comprises at least three of the guide members.

3. A wafer processing system according to claim 1, wherein the guide members comprise a first guide member movable from the expanded configuration to the contracted configuration so as to reduce the first cross-sectional dimension of the frame assembly receiving area.

4. A wafer processing system according to claim 3, wherein the guide members comprise a second guide member, wherein the first and second guide members are disposed on substantially opposite sides of the frame assembly receiving area.

5. A wafer processing system according to claim 4, wherein the second guide member is movable from the expanded configuration to the contracted configuration to reduce the first cross-sectional dimension of the frame assembly receiving area.

6. A wafer processing system according to claim 5, wherein the guide members comprise a third guide member movable from the expanded configuration to the contracted configuration so as to reduce the second cross-sectional dimension of the frame assembly receiving area.

7. A wafer processing system according to claim 1, wherein each of the guide members that are movable are movable by a distance in the range of 5-30 mm, 6-20 mm, or 7.5-15 mm.

8. A wafer processing system according to claim 1, wherein the at least one support comprises a plurality of support pins.

9. A wafer processing system according to claim 1, wherein the positioning assembly further comprises a body, and the guide members are mountable on the body to define the frame assembly receiving area.

10. A wafer processing system according to claim 9, wherein the at least one support is mountable on the body of the positioning assembly so that when the frame assembly is supported on the at least one support, the frame assembly is spaced apart from the body.

11. A wafer processing system according to claim 9, wherein the body comprises a core and arms extending radially outwardly from the core, wherein the guide members are mountable on the arms to define the frame assembly receiving area.

12. A wafer processing system according to claim 9, wherein at least one of the guide members is mountable on the body at a plurality of radially different locations.

13. A wafer processing system according to claim 1, wherein a biasing means, such as an extension spring, biases the guide members towards the contracted configuration.

14. A wafer processing system according to claim 1, wherein a part of the actuating assembly extends through a wall of the transport vacuum chamber via a vacuum feedthrough.

15. A wafer processing system according to claim 1, wherein the positioning assembly is movable between a raised position and a lowered position.

16. A wafer processing system according to claim 15, wherein the positioning assembly is movable between the raised and lowered positions by a distance in the range of 10-100 mm, 25-75 mm, 30-50 mm, or about 40 mm.

17. A wafer processing system according to claim 15, further comprising at least one auxiliary frame support for supporting the frame assembly when the positioning assembly is in the lowered position.

18. A wafer processing system according to claim 1, further comprising an orientation adjuster for rotating the positioning assembly.

19. A wafer processing system according to claim 1, further comprising a plurality of the alignment devices disposed within the transport vacuum chamber.

20. A transport vacuum chamber for handling a frame assembly under vacuum conditions comprising:
  an alignment device for adjusting a translational and rotational position of the frame assembly into alignment with a target position within the transport vacuum chamber; and
  a transfer robot disposed within the transport vacuum chamber for transferring the frame assembly onto the alignment device;
  wherein the alignment device comprises:
  a positioning assembly disposed within the transport vacuum chamber comprising a plurality of guide members that are arranged to define a frame assembly receiving area within the transport vacuum chamber;
  at least one support for supporting the frame assembly in the frame assembly receiving area; and
  an actuating assembly operable to change the plurality of guide members from an expanded configuration to a contracted configuration so as to reduce a first cross-sectional dimension of the frame assembly receiving area and to reduce a second cross-sectional dimension of the frame assembly receiving area that is perpendicular to the first cross-sectional dimension;
  wherein when the plurality of guide members change from the expanded configuration to the contracted configuration while the frame assembly is supported on the at least one support, the plurality of guide members engage with the frame assembly so as to adjust the translational and/or rotational position of the frame assembly into alignment with the target position.

21. A method of adjusting a translational and rotational position of a frame assembly into alignment with a target position under vacuum conditions using a transport vacuum chamber according to claim 20, the method comprising the steps of:

a. configuring the plurality of guide members into the expanded configuration;
b. positioning the frame assembly onto the at least one support in the frame assembly receiving area;
c. changing the plurality of guide members from the expanded configuration to the contracted configuration so that the plurality of guide members engage with the frame assembly so as to adjust the translational and/or rotational position of the frame assembly into alignment with the target position.

22. A method according to claim 21, wherein the frame assembly is of the type comprising a pair of parallel diametrically opposed straight edges, and the guide members engage with at least the pair of parallel diametrically opposed straight edges.

23. A method according to claim 21, further comprising a step of unloading the frame assembly from the support by:
  i. changing the guide members from the contracted configuration into the expanded configuration;
  ii. positioning a part of the transfer robot between the frame assembly and the positioning assembly; and
  iii. lowering the positioning assembly so that the frame assembly is lowered onto the end effector of the transfer robot.

24. A method according to claim 21, wherein the method is performed prior to loading the frame assembly into a cassette vacuum chamber or a wafer processing module.

25. A method of handling a frame assembly under vacuum conditions using the wafer processing system according to claim 1, the method comprising the steps of:
  providing a frame assembly on the transfer robot that is disposed within the transport vacuum chamber;
  transferring the frame assembly from the transfer robot onto the alignment device;
  aligning the translational and rotational position of the frame assembly into alignment with the target position using the alignment device; and
  subsequently transferring the frame assembly from the alignment device to the at least one vacuum cassette elevator load lock or to the at least one wafer processing module.

* * * * *